United States Patent
Yoon (10) Patent No.: US 7,877,675 B2
(45) Date of Patent: Jan. 25, 2011

(54) SEMICONDUCTOR MEMORY APPARATUS CAPABLE OF DETECTING ERROR IN DATA INPUT AND OUTPUT

(75) Inventor: Sang-Sic Yoon, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 1062 days.

(21) Appl. No.: 11/646,359

(22) Filed: Dec. 28, 2006

(65) Prior Publication Data
US 2008/0082900 A1 Apr. 3, 2008

(30) Foreign Application Priority Data
Sep. 13, 2006 (KR) .................... 10-2006-0088740

(51) Int. Cl.
*G06F 11/00* (2006.01)
(52) U.S. Cl. .................. 714/799; 714/768; 714/807
(58) Field of Classification Search ................ 714/799, 714/768, 807, 763, 701, 758, 702, 752
See application file for complete search history.

(56) References Cited

U.S. PATENT DOCUMENTS

| | | | |
|---|---|---|---|
| 6,742,146 B2 * | 5/2004 | Gross et al. | .................. 714/702 |
| 7,114,117 B2 * | 9/2006 | Tamura et al. | .............. 714/763 |
| 7,139,852 B2 | 11/2006 | LaBerge | |
| 7,454,017 B2 * | 11/2008 | Kaminaga et al. | ............. 380/46 |

| | | | |
|---|---|---|---|
| 2003/0123389 A1 | 7/2003 | Russell et al. | |

FOREIGN PATENT DOCUMENTS

| | | |
|---|---|---|
| JP | 57-169867 A | 10/1982 |
| JP | 02-143991 | 6/1990 |
| JP | 5-158810 A | 6/1993 |
| JP | 2002-175697 A | 6/2002 |
| KR | 1020010071455 | 7/2001 |

* cited by examiner

*Primary Examiner*—Fritz Alphonse
(74) *Attorney, Agent, or Firm*—Venable LLP; Jeffri A. Kaminski; Leigh D. Thelen (57) ABSTRACT

A semiconductor memory apparatus capable of detecting an error in data input/output includes a memory cell block including a plurality of memory cells. A data input unit receives data from outside the semiconductor memory apparatus and performs predetermined signal processing to record the received data in the memory cell block. A first global data line is connected between the data input unit and the memory cell block. A data output unit receives data from the memory cell block and performs predetermined signal processing to output the received data to the outside of the semiconductor memory apparatus. A second global data line is connected between the memory cell block and the data output unit. A multiplexer selectively outputs data from the first or second global data line in response to a control signal. An error detection code generator generates an error detection code having a plurality of bits to detect whether the data output from the multiplexer includes an error, and outputs the error detection code to the outside of the semiconductor memory apparatus.

27 Claims, 6 Drawing Sheets

SEMICONDUCTOR MEMORY APPARATUS CAPABLE OF DETECTING ERROR IN DATA INPUT AND OUTPUT

BACKGROUND

1. Technical Field

Disclosed herein is a semiconductor memory apparatus, and more particularly, a semiconductor memory apparatus capable of detecting an error in data input/output.

2. Related Art

Figure 1:
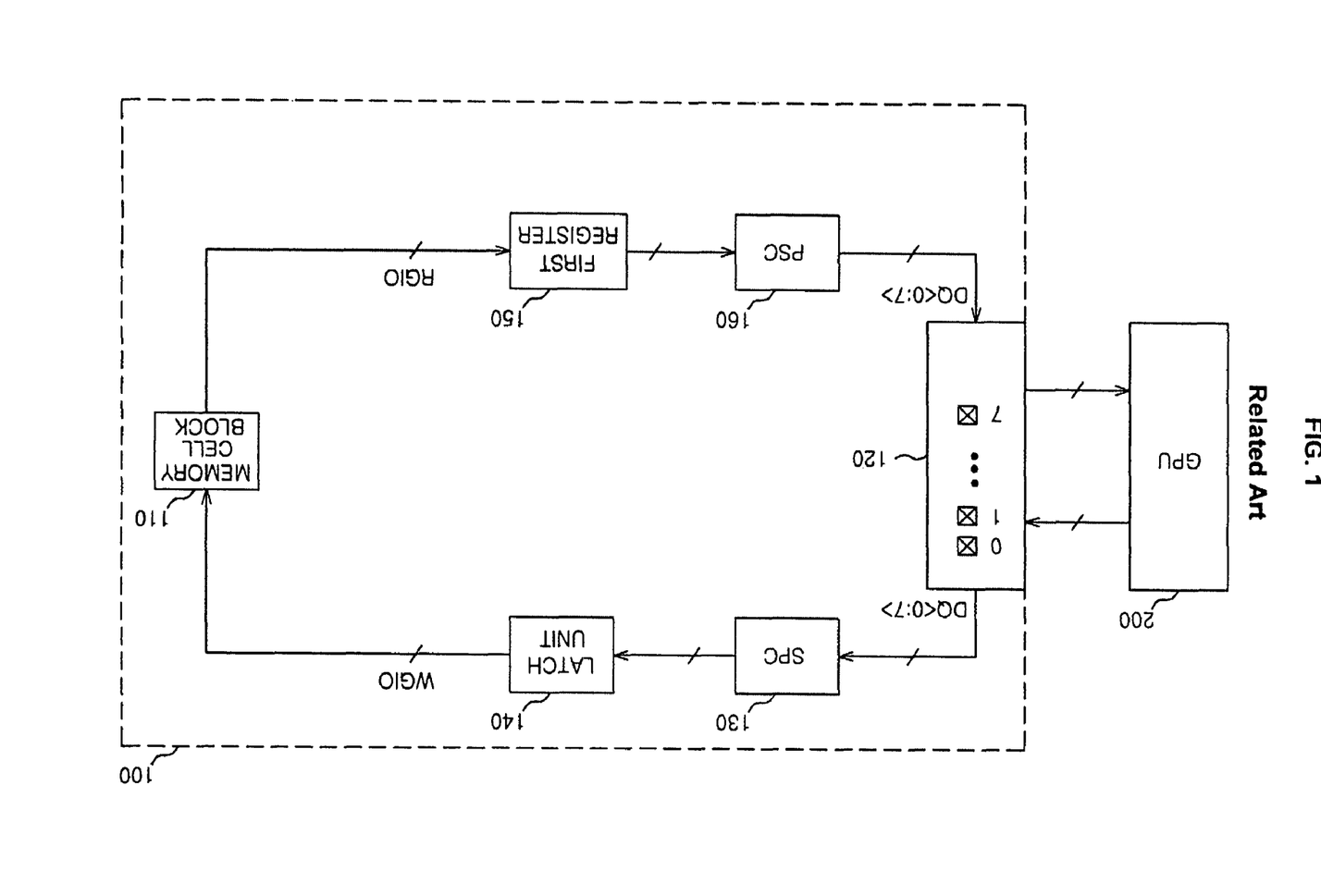
FIG. 1 is a block diagram of a conventional semiconductor memory apparatus.

Referring to FIG. 1, a conventional semiconductor memory apparatus 100 includes a memory cell block 110, a pad 120, a serial-to-parallel converter (SPC) 130, a latch unit 140, a register 150, and a parallel-to-serial converter (PSC) 160.

The number of data input/output pins the pad 120 has depends on the memory capacity, model, etc. In FIG. 1, a pad 120 with eight data input/output pins DQ<0:7> is shown by way of example.

The SPC 130 receives serial data from a graphic processing unit (GPU) 200 of a chipset having a built-in semiconductor memory apparatus 100 through each pin of the pad 120, converts the serial data into parallel data, and outputs the parallel data to the latch unit 140.

The latch unit 140 latches the parallel data output from the SPC 130, and outputs it to a memory cell block 110 through a write global data input/output (WGIO) line.

The register 150 receives the parallel data from the memory cell block 110 and outputs it to the PSC 160 through a read global data input/output (RGIO) line by a first-in, first-out (FIFO) method.

The PSC 160 receives the parallel data from the register 150 converts the parallel data into the serial data, and outputs the serial data to the GPU 200 via the respective pins of the pad 120.

With this configuration, data input/output is performed between the semiconductor memory apparatus 100 and the GPU 200. In this instance, data input/output denotes not only a write operation whereby the data output from the GPU 200 is stored in a predetermined address of a memory cell block 110 via the pad 110, the SPC 130 and the latch unit 140, but also a read operation that the data is output from the memory cell block 110 to the GPU 200 via the register 150, the PSC 160 and the pad 110.

In a conventional semiconductor memory apparatus such as a very high speed graphic memory of more than 2 giga bits per second (GBPS), error probability in the data transmission increases on a data transmission path between the GPU 200 and the semiconductor memory apparatus 100 as the speed of the data transmission becomes higher.

However, a conventional semiconductor memory apparatus has no means to detect or solve an error in the data transmission, which may arise on the data transmission path between the GPU 200 and the semiconductor memory apparatus 100, thereby causing a fatal error.

SUMMARY

Embodiments of the present invention may provide a semiconductor memory apparatus capable of detecting an error in data input/output, to detect an error in data transmission between the semiconductor memory apparatus and a system using the same.

An embodiment of the present invention provides a semiconductor memory apparatus capable of detecting an error in data input/output may include: a memory cell block that may include a plurality of memory cells; a data input unit that may receive external data and may perform predetermined signal processing to record the received data in the memory cell block; a first global data line that may be coupled between the data input unit and the memory cell block; a data output unit that may receive data from the memory cell block and may perform predetermined signal processing to output the received data from the semiconductor memory apparatus; a second global data line that may be coupled between the memory cell block and the data output unit; a multiplexer that may selectively output data from the first or second global data line in response to a control signal; and an error detection code generator that may generate an error detection code having a plurality of bits to detect whether the data output from the multiplexer includes an error, and may output the error detection code from the semiconductor memory apparatus.

Another embodiment of the present invention provides a semiconductor memory apparatus capable of detecting an error in data input/output, comprising: a memory cell block that may include a plurality of memory cells; a data input unit that may receive external data and may perform predetermined signal processing to record the received data in the memory cell block; a first global data line that may be coupled between the data input unit and the memory cell block; a first data bus inversion unit provided on the first global data line, that may invert the data received through the first global data line according to the comparison result of the data and previous data, and may output the inverted data to the memory cell block; a data output unit that may receive data from the memory cell block and may perform predetermined signal processing to output the received data from the semiconductor memory apparatus; a second global data line that may be coupled between the memory cell block and the data output unit; a second data bus inversion unit provided on the second global data line, that may invert the data received from the memory cell block through the second global data line according to the comparison result of the data and previous data, and may output the inverted data; a multiplexer that may selectively output data from the first global data line coupled between the data input unit and the first data bus inversion unit or the second global data line coupled between the second data bus inversion unit and the data output unit according to whether the semiconductor memory apparatus is in a read or write operation; and an error detection code generator that may generate an error detection code having a plurality of bits to detect whether the data output from the multiplexer includes an error, and may output the error detection code from the semiconductor memory apparatus.

Still another embodiment of the present invention provides a semiconductor memory apparatus capable of detecting an error in data input/output, comprising: a memory cell block that may include a plurality of memory cells; a data input unit configured to receive external data and may perform predetermined signal processing to record the received data in the memory cell block; a data output unit configured to receive data from the memory cell block and may perform predetermined signal processing to output the received data from the semiconductor memory apparatus; a global data line that may be commonly coupled between the memory cell block and the data input unit and between the memory cell block and the data output unit; and an error detection code generator configured to generate an error detection code having a plurality of bits to detect whether the data transmitted through the global data line includes an error, and outputs the error detection code from the semiconductor memory apparatus.

Yet another embodiment of the present invention provides a semiconductor memory apparatus capable of detecting an error in data input/output, comprising: a memory cell block that may include a plurality of memory cells; a data input unit configured to receive external data and perform predetermined signal processing to record the received data in the memory cell block; a data output unit configured to receive data from the memory cell block and perform predetermined signal processing to output the received data from the semiconductor memory apparatus; a global data line commonly coupled between the memory cell block and the data input unit and between the memory cell block and the data output unit; a data bus inversion unit provided on the global data line, configured to invert data interactively transmitted through the global data line according to the comparison result of the data and previous data, and output the inverted data; and an error detection code generator configured to generate an error detection code having a plurality of bits to detect whether the data input to and output from the data bus inversion unit includes an error, and output the error detection code from the semiconductor memory apparatus.

A further understanding of the nature of embodiments of the present invention herein may be realized by reference to the remaining portions of the specification and the attached drawings.

BRIEF DESCRIPTION OF THE FIGURES

Non-limiting and non-exhaustive embodiments of the present invention will be described with reference to the following figures, wherein like reference numerals refer to like parts throughout the various figures unless otherwise specified. In the figures.

DETAILED DESCRIPTION OF EXEMPLARY EMBODIMENTS

Embodiments of the present invention will be described below in more detail with reference to the accompanying drawings. The present invention may, however, be embodied in different forms and should not be construed as being limited to the embodiments set forth herein. Rather, these embodiments are provided so that this disclosure will be thorough and complete, and will fully convey the scope of the present invention to those skilled in the art. Like reference numerals refer to like elements throughout the accompanying figures.

An exemplary embodiment of the present invention will be described in conjunction with the accompanying drawings.

Figure 2:
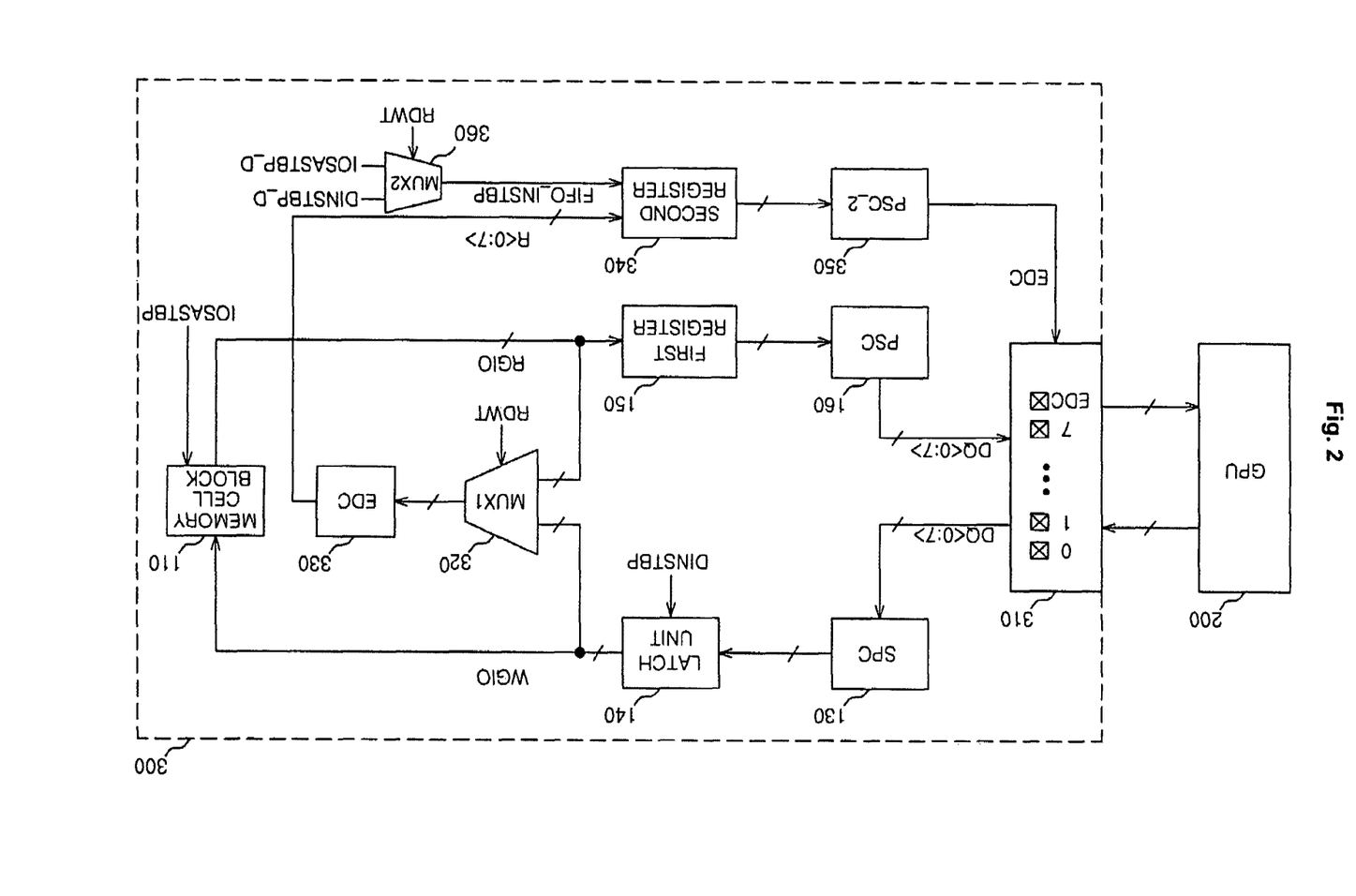
FIG. 2 is a block diagram of a semiconductor memory apparatus capable of detecting an error in data input/output according to a first exemplary embodiment of the present invention.
Figure 3:
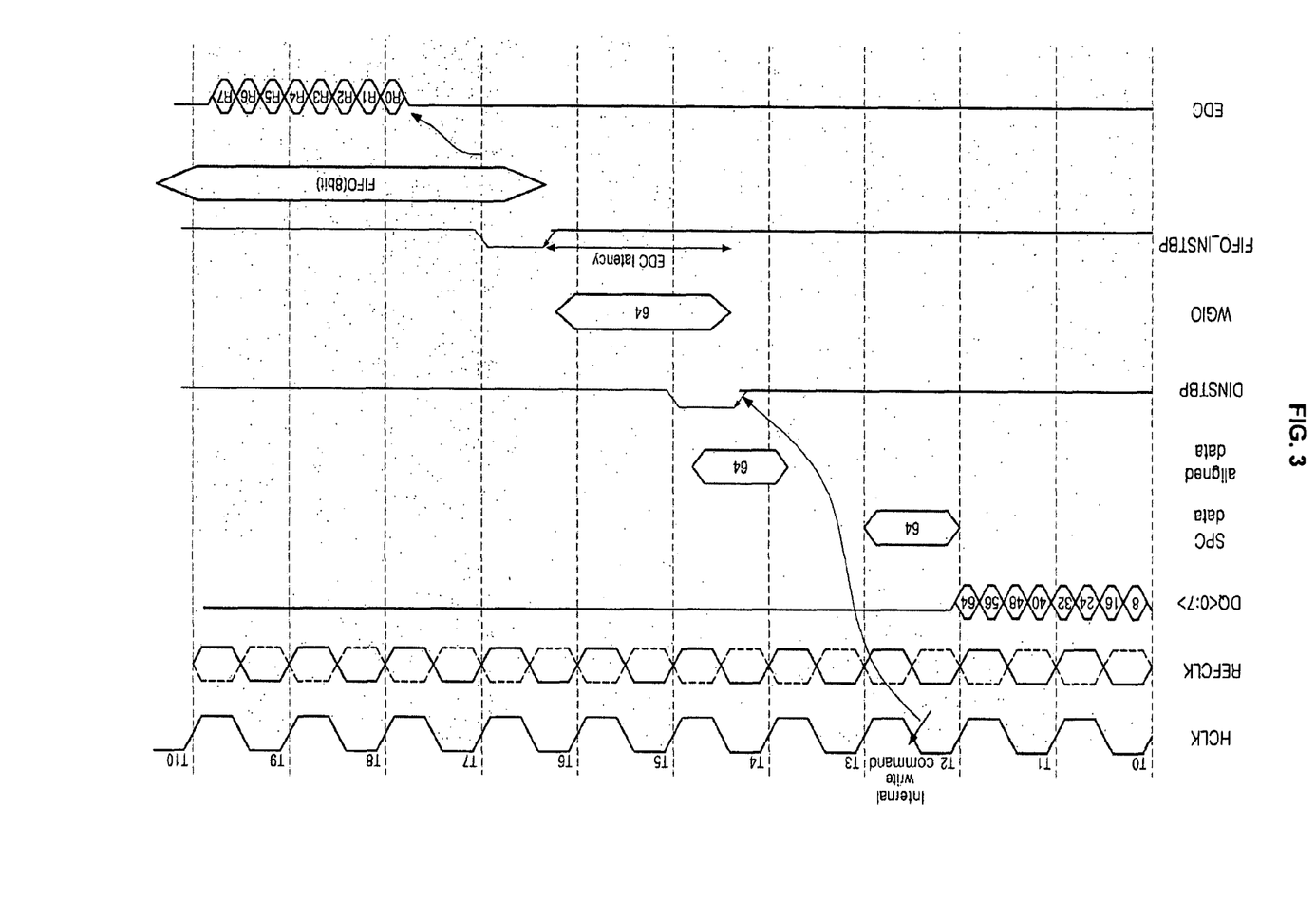
FIG. 3 is a timing diagram illustrating the data input/output operation in the semiconductor memory apparatus capable of detecting an error in the data input/output according to an exemplary embodiment of the present invention.
Figure 4:
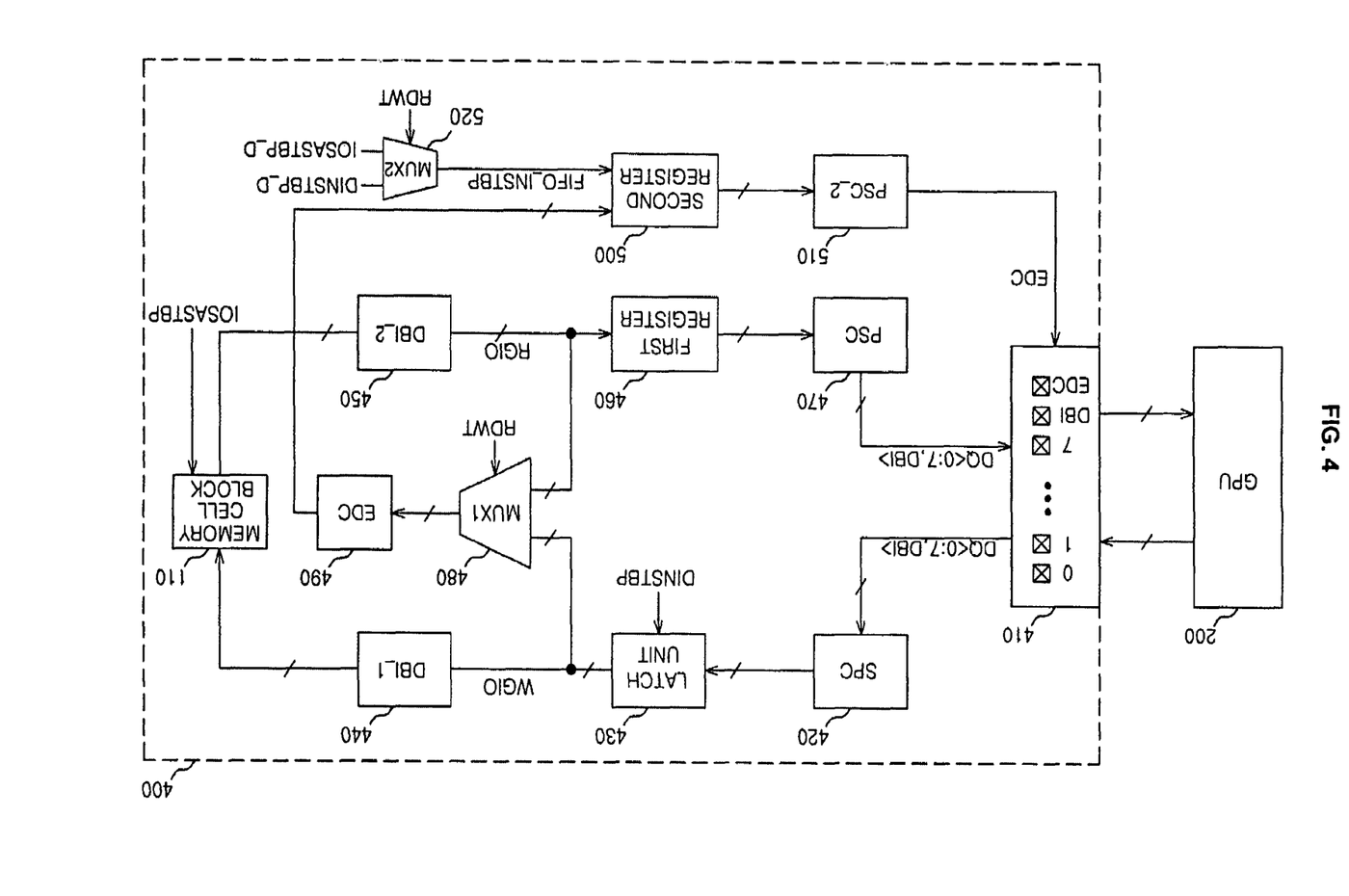
FIG. 4 is a block diagram of a semiconductor memory apparatus capable of detecting an error in data input/output according to a second exemplary embodiment of the present invention.
Figure 5:
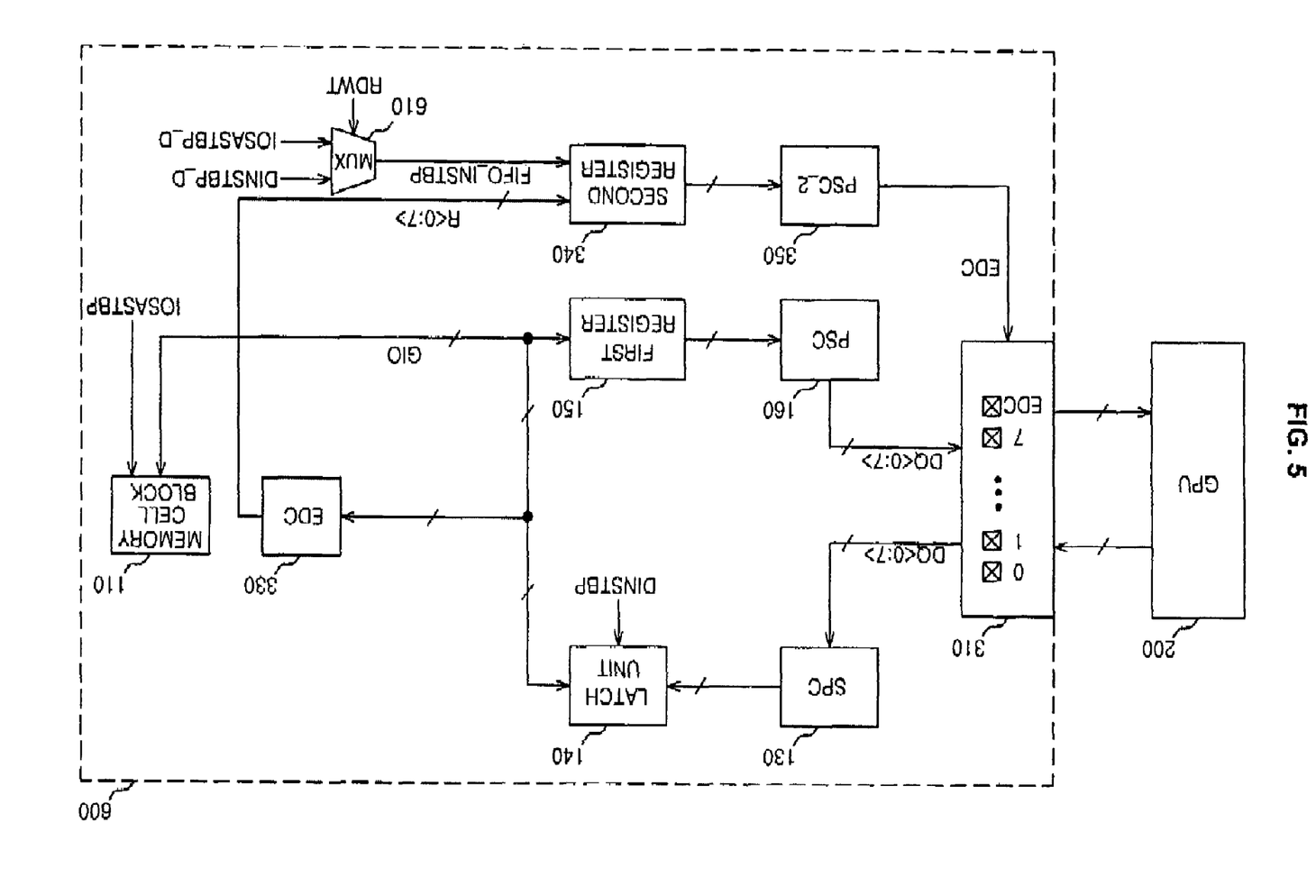
FIG. 5 is a block diagram of a semiconductor memory apparatus capable of detecting an error in data input/output according to a third exemplary embodiment of the present invention.
Figure 6:
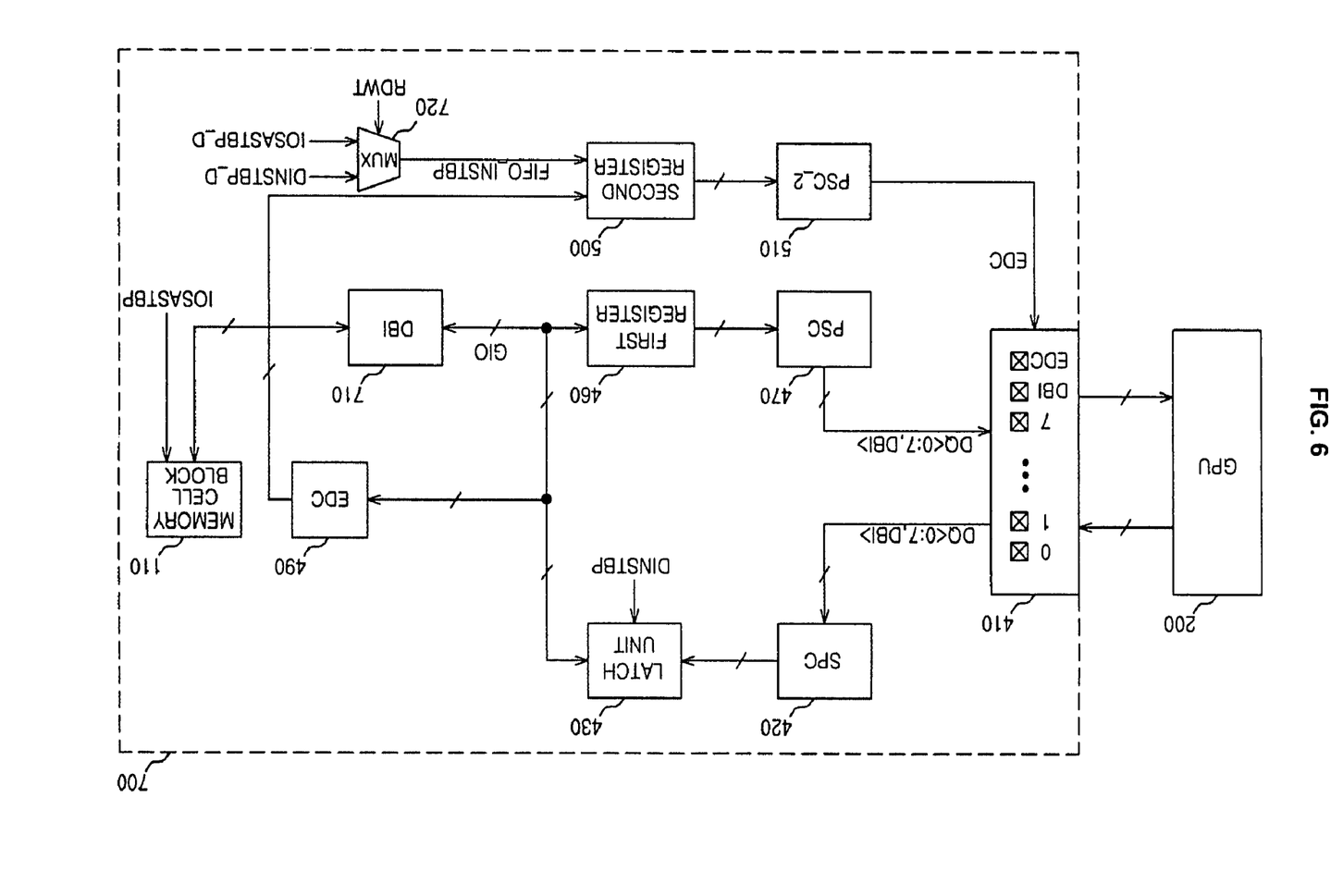
FIG. 6 is a block diagram of a semiconductor memory apparatus capable of detecting an error in data input/output according to a fourth exemplary embodiment of the present invention.

FIG. 2 is a block diagram of a semiconductor memory apparatus capable of detecting an error in data input/output according to a first exemplary embodiment of the present invention, FIG. 3 is a timing diagram illustrating the data input/output operation in the semiconductor memory apparatus capable of detecting an error in the data input/output according to an exemplary embodiment of the present invention, FIG. 4 is a block diagram of a semiconductor memory apparatus capable of detecting an error in data input/output according to a second exemplary embodiment of the present invention, FIG. 5 is a block diagram of a semiconductor memory apparatus capable of detecting an error in data input/output according to a third exemplary embodiment of the present invention; and FIG. 6 is a block diagram of a semiconductor memory apparatus capable of detecting an error in data input/output according to a fourth exemplary embodiment of the present invention.

First Embodiment

As shown FIG. 2, a semiconductor memory apparatus 300 capable of detecting an error in data input/output according to a first embodiment of the present invention may include; a memory cell block 110 provided with a plurality of memory cells; a pad 310 having a plurality of data input/output pins DQ<0:7> and an error detection code (EDC) pin; a data input unit 130, 140 that includes a serial-to-parallel converter (hereinafter, referred to as an "SPC") 130 and a latch unit 140 that may operate in response to a first timing signal DINSTBP and may perform predetermined signal processing to record data, received from outside the semiconductor memory apparatus 300, i.e., from a graphic processing unit (GPU) 200 of a chipset having a built-in semiconductor memory apparatus 100 through the pad 310, in the memory cell block 110; a first global data line WGIO coupled between the data input unit 130, 140 and the memory cell block 110; a data output unit 150, 160 that may include a first register 150 and a first parallel-to-serial converter (hereinafter, referred to as a "PSC") 160, that may perform predetermined signal processing to output data received from the memory cell block 110 to the outside of the semiconductor memory apparatus 300 through the pad 310; a second global data line RGIO coupled between the memory cell block 110 and the data output unit 150, 160; a first multiplexer (hereinafter, referred to as a "MUX1") 320 which may selectively output the data from the first global data line WGIO or the second global data line RGIO in response to a control signal RDWT; an error detection code generator (hereinafter, referred to as an "EDC") 330 which may generate an error detection code R<0:7> including a plurality of bits to detect whether or not the data output from the MUX1 320 includes an error, and output the error detection code R<0:7> to the outside of the semiconductor memory apparatus 300; a second register 340 which stores the error detection code R<0:7> and output it in a predetermined bit unit in response to a second timing signal FIFO_INSTBP; a second multiplexer (hereinafter, referred to as a "MUX") 360 which may select one of the different timing signals DINSTBP_D and IOSASTBP_D in response to the control signal RDWT and output the selected signal as the timing signal FIFO_INSTBP; and a second parallel-to-serial converter (PSC_2) 350 which may perform parallel-to-serial conversion of the error detection code R<0:7> received from the second register 340.

The memory cell block 110 may output data in response to an input/output sense amplifier strobe signal IOSASTBP.

The SPC 130 may convert 8-bit serial data input through the respective data input/output pins DQ<0:7> of the pad 310 into 64-bit parallel data.

The latch unit 140 may latch the 64-bit parallel data and output it to the first global data line WGIO in response to the first timing signal DINSTBP.

The first timing signal DINSTBP is generated by delaying a write command input from the outside of the semiconductor memory apparatus 300 by a predetermined time to match the internal signal processing timing.

The register 150 may store the 64-bit parallel data received from the memory cell block 110 through the second global data line RGIO, and output it by a FIFO method.

The PSC 160 may convert the parallel data sequentially output from the register 150 into serial data, and output it as an 8-bit unit through the respective data input/output pins DQ<0:7> of the pad 310.

The control signal RDWT varies in level according to whether the semiconductor memory apparatus is in a read operation or a write operation.

The EDC 330 may be varied in internal logic, output bit number, etc. according to a joint electron device engineering council (JEDEC) format or a other format. As an example of the possible formats, there is a cyclic redundancy check (CRC) 8 format. The CRC8 format is configured to output an error detection code of 8-bits from 64-bits. According to the CRC8 format, the EDC 330 divides a decimal value of the data output from the MUX1 320 by a preset divisor and calculates a decimal value corresponding to the remainder, thereby generating an error detection code of 8-bits corresponding to the calculated decimal value. For example, if a decimal value of the data output from the MUX1 320 is "10" and a preset divisor is "7," the remainder of the foregoing division is "3," so that a binary code of 8-bits corresponding to the remainder is output as the error detection code R<0:7>. This logic is described by way of example, and may vary according to the circuit design.

The second register 340 may store the error detection code R<0:7> and output it by the FIFO method in response to the second timing signal FIFO_INSTBP.

The MUX2 360 may select one of the signals DINSTBP_D and IOSASTBP_D which may be different in timing from each other, in response to the control signal RDWT, and outputs the selected signal as the second timing signal FIFO_ISTRB. If the semiconductor memory apparatus is in a read operation, the signal IOSASTBP_D is output as the second timing signal FIFO_ISTRB. If the semiconductor memory apparatus is in a write operation, the signal DINSTBP_D is output as the second timing signal FIFO_ISTRB. Here, the signal IOSASTBP_D may be obtained by delaying a signal IOSASTBP, used for setting the data output timing of the memory cell block 110, by a data processing time margin of the EDC 330. Further, the signal DINSTBP_D may be obtained by delaying a signal DINSTBP, used for setting the data output timing of the latch unit 140, by a data processing time margin of the EDC 330. Accordingly, the second timing signal FIFO_ISTRB may be enabled after a lapse of the data processing time of the BDC 330 from the time when the latch unit 140 starts to output the data, and is enabled after a lapse of the data processing time of the EDC 330 from the time when the memory cell block 110 starts to output the data.

The PSC-2 350 may perform a parallel-to-serial conversion of the error detection code R<0:7> output from the second register 340, and then output the converted error detection code to the EDC pins of the pad 310.

With this configuration according to an exemplary embodiment of the present invention, the semiconductor memory apparatus capable of detecting an error in the data input/output generates an error detection code during the write operation, which will be described with reference to FIG. 3.

First, the SPC 130, the PSC 160 and the PSC_2 350 in FIG. 2 are operated in response to the timing of an external clock REFCLK, but the others in FIG. 2 are operated in response to the timing of an internal clock HCLK.

An external write command is input, and 64-bit serial data is input as 8-bit through the respective data input/output pins DQ<0:7> of the pad 310.

The SPC 130 may convert the 64-bit serial data into 64-bit parallel data in response to the external clock REFCLK, thereby outputting the 64-bit parallel data to the latch unit 140.

After a predetermined time elapses from the time when the external write command is input, an internal write command may be generated during a period T2 of the internal clock HCLK. Then, the signal DINSTBP obtained by delaying the internal write command is generated during a period T4.

The 64-bit parallel data converted through the SPC 130 may be delayed by a predetermined time in the latch unit 140, and aligned with the high level signal DINSTBP.

The latch unit 140 may output the aligned data to the memory cell block 110 through the WGIO in response to the signal DINSTBP.

While the semiconductor memory apparatus 300 is in the write operation, the MUX 320 may select the data on the WGIO in response to the RDWT and output the selected data to the EDC 330. Then, the EDC 330 may obtain the remainder by dividing the received data by a preset divisor and generate the error detection code R<0:7> corresponding to the remainder, thereby outputting the error detection code R<0:7> to the second register 340.

The second register 340 may store and output the error detection code R<0:7> by the FIFO method according to the FIFO-INSTBP generated as the MUX2 360 selects the DINSTBP_D.

The PSC_2 350 may convert the error detection code R<0:7> output from the second register 340 into serial data, and outputs the serial data in sequence through the EDC pins of the pad 310.

The GPU 200 recognizes a decimal value of its own data to be output and also recognizes the preset divisor used in the EDC 330, so that it recognizes the error detection code R<0:7> to be output from the semiconductor memory apparatus 300 according to its own data to be output. Accordingly, if the error detection code R<0:7> output from the semiconductor memory apparatus 300 is equal to the recognized code, it is determined that the data is normally transmitted. On the other hand, if the error detection code R<0:7> output from the semiconductor memory apparatus 300 is not equal to the recognized code, it is determined that there is an error in the data transmission. In this case, the GPU 200 transmits the data again.

In the meantime, the semiconductor memory apparatus, capable of detecting an error in the data input/output according to an exemplary embodiment of the present invention, may generate the error detection code during the read operation, which may be similar to the operation during the write operation except that the MUX1 320 may select the data on the RGIO and output it to the EDC 330, and the MUX2 360 may select IOSASTBP_D and generate the FIFO_INSTBP. Accordingly, repetitive descriptions thereof will be avoided as necessary.

The first global data line WGIO and the second global data line RGIO may be used for the write operation and the read operation of the semiconductor memory apparatus, respectively. As compared with other signal lines, the first and second global data lines WGIO and RGIO may be disposed throughout the largest area of the semiconductor memory apparatus 300, and secure the most layout margin. Accordingly, the data used for generating the error detection code R<0:7> is received through the first and second global data lines WGIO and RGIO, thereby minimizing the wiring and circuit areas owing to the configuration related to generation of the error detection code.

Second Embodiment

As shown in FIG. 4, a semiconductor memory apparatus 400 capable of detecting an error in data input/output according to a second embodiment of the present invention may include; a memory cell block 110 provided with a plurality of memory cells; a pad 410 having a plurality of data input/output pins DQ<0:7>, a data bus inversion (DBI) pin and an error detection code (EDC) pin; a data input unit 420, 430 that includes a serial-to-parallel converter (hereinafter, referred to as an "SPC") 420 and a latch unit 430 configured to operate in response to a first timing signal DINSTBP and may perform predetermined signal processing to record data, received from the outside of the semiconductor memory apparatus 400, i.e., from a graphic processing unit (GPU) 200 of a chipset having a built-in semiconductor memory apparatus 400 through the pad 410 in the memory cell block 110; a first global data line WGIO coupled between the data input unit 420, 430 and the memory cell block 110; a first data bus inversion unit (hereinafter, referred to as "DBI_1") 440 provided on the first global data line WGIO that may invert the data output from the latch unit 430 according to the comparison result of the data and previous data, i.e., in response to the DBI signal input through the DBI pin of the pad 410 in order to output it to the memory cell block 110; a data output unit 460, 470 that may include a first register 460 and a first parallel-to-serial converter (hereinafter, referred to as a "PSC") 470, and that may perform predetermined signal processing to output data received from the memory cell block 110 to the outside of the semiconductor memory apparatus 400 through the pad 410; a second global data line RGIO coupled between the memory cell block 110 and the data output unit 460, 470; a second data bus inversion unit (hereinafter, referred to as "DBI_2") 450 provided on the second global data line RGIO that may invert the data output from the memory cell block 110 according to the comparison result of the data and previous data, generate a DBI signal according to the compared results, and output the DBI signal along with the inverted data; a first multiplexer (hereinafter, referred to as a "MUX1") 480 which may selectively output the data on the first global data line WGIO between the latch unit 430 and the DBI_1 440, or the data on the second global data line RGIO between the DBI_2 450 and the first register 460, in response to a control signal RDWT; an error detection code generator (hereinafter, referred to as an "EDC") 490 which may generate an error detection code R<0:7> including a plurality of bits to detect whether or not the data output from the MUX1 480 includes an error, and output the error detection code R<0:7> to the outside of the semiconductor memory apparatus 400; a second register 500 which may store the error detection code R<0:7>, and outputs it in a predetermined bit unit in response to a second timing signal FIFO_INSTBP; a second multiplexer (hereinafter, referred to as a "MUX2") 520 which may select one of the different timing signals DINSTBP_D and IOSASTBP_D in response to the control signal RDWT and output the selected signal as the second timing signal FIFO_INSTBP; and a second parallel-to-serial converter (PSC_2) 510 which may perform parallel-to-serial conversion of the error detection code R<0:7> received from the second register 500.

A DBI function employs the DBI signal, added separately from the data, to invert the data, thereby preventing a problem of simultaneous switching noise or inter-symbol interference from arising when the number of inverted bits in current data increases compared with that of previous data bits among the total data bits during data transmission.

According to the second exemplary embodiment of the present invention, the semiconductor memory apparatus 400 may have the foregoing DBI function, in which the DBI_1 440 and the DBI_2 450 are coupled to the first global data line WGIO and the second global data line RGIO, respectively. The semiconductor memory apparatus 400 may receive 72-bit data that includes 64-bit data and the DBI signal of 8 bits, and the DBI_1 440 may send the memory cell block 110 the 64-bit data which may be inverted or not inverted on the basis of the DBI signal of 8-bits. Further, the DBI_2 450 may compare the 64-bit data output from the memory cell block 110 with the previous data output from the memory cell block 110, and may output the DBI signal of 8-bits, thereby outputting 72-bit data that includes 64-bit data and the DBI signal of 8 bits to the GPU 200 through the pad 410. As compared with the first exemplary embodiment, this second exemplary embodiment may only be different in the number of data bits to be processed, but may be similar in the read and write operations and generation of an error detection code R<0:7> of the semiconductor memory apparatus 400.

According to the second exemplary embodiment of the present invention, to make the data used for generating the error detection code R<0:7> be 72-bits including the DBI signal, the data may be received from the first global data line WGIO coupled to an input terminal of the DBI_1 440 or the second global data line RGIO coupled to an output terminal of the DBI_2 450. Like the first exemplary embodiment, the second exemplary embodiment may employ the first global data line WGIO and the second global data line RGIO, thereby minimizing the wiring and circuit areas for generation of the error detection code.

Third Embodiment

As shown in FIG. 5, a semiconductor memory apparatus 600 capable of detecting an error in data input/output according to a third embodiment of the present invention may include; a memory cell block 110 provided with a plurality of memory cells; a pad 310 having a plurality of data input/output pins DQ<0:7> and an error detection code (EDC) pin; a data input unit 130, 140 that may include a serial-to-parallel converter (hereinafter, referred to as an "SPC") 130 and a latch unit 140 configured to operate in response to a first timing signal DINSTBP and perform predetermined signal processing to record data, received from the outside of the semiconductor memory apparatus 600, i.e., from a graphic processing unit (GPU) 200 of a chipset having a built-in semiconductor memory apparatus 600 through the pad 310, in the memory cell block 110; a data output unit 150, 160 that may include a first register 150 and a first parallel-to-serial converter (hereinafter, referred to as a "PSC") 160, that may perform predetermined signal processing to output data received from the memory cell block 110 to the outside of the semiconductor memory apparatus 600 through the pad 310; a common global data line GIO commonly coupled between the memory cell block 110 and the data input unit 130, 140 and between the memory cell block 110 and the data output unit 150, 160; an error detection code generator (hereinafter, referred to as an "EDC") 330 which may generate an error detection code R<0:7> including a plurality of bits to detect whether or not an error in interactive data transmission, and output the error detection code R<0:7> to the outside of the semiconductor memory apparatus 600; a second register 340 which may store the error detection code R<0:7>, and output it in a unit of predetermined bits in response to a second timing signal FIFO_INSTBP; a multiplexer (hereinafter, referred to as a "MUX") 610 which may select one of the different timing signals DINSTBP_D and IOSASTBP_D in response to a control signal RDWT and output the selected signal as a second timing signal FIFO_INSTBP; and a second parallel-to-serial converter (PSC_2) 350 which may perform parallel-to-serial conversion on the error detection code R<0:7> received from the second register 340.

According to the third exemplary embodiment of the present invention, the common global data line GIO may be shared between a write operation and a read operation of the semiconductor memory apparatus 600. Like the first and second exemplary embodiments, the EDC 330 may receive the data through the common global data line GIO and generates the error detection code R<0:7>. Because the common global data line GIO may be shared, no multiplexer is needed to select the data transmitted to the EDC 330. Further, the read and write operations and the generation of the error detection code R<0:7> of the semiconductor memory apparatus 600 may be similar to those of the first embodiment.

According to the third exemplary embodiment of the present invention, the common global data line GIO shared between the write operation and the read operation of the semiconductor memory apparatus may be disposed throughout the largest area in the semiconductor memory apparatus 600 as compared with other signal lines and secure the most layout margin. Thus, the data used for generating the error detection code R<0:7> is received from the common global data line GIO, thereby minimizing the wiring and circuit areas due to the configuration for generation of the error detection code. Further, the wiring for inputting the data to the EDC 330 may be coupled to any part of the common global data line GIO coupled between the memory cell block 110 and the data input unit 130, 140 and between the memory cell block 110 and the data output unit 150, 160.

Fourth Embodiment

As shown in FIG. 6, a semiconductor memory apparatus 700 capable of detecting an error in data input/output according to a fourth embodiment of the present invention may include a memory cell block 110 provided with a plurality of memory cells; a pad 410 having a plurality of data input/output pins DQ<0:7>, a data bus inversion (DBI) pin and an error detection code (EDC) pin; a data input unit 420, 430 that may include a serial-to-parallel converter (hereinafter, referred to as an "SPC") 420 and a latch unit 430 configured to operate in response to a first timing signal DINSTBP and that may perform predetermined signal processing to record data, received from the outside of the semiconductor memory apparatus 700, i.e., from a graphic processing unit (GPU) 200 of a chipset having a built-in semiconductor memory apparatus 700 through the pad 410, in the memory cell block 110; a data output unit 460, 470 that may include a first register 460 and a first parallel-to-serial converter (hereinafter, referred to as a "PSC") 470, and that may perform predetermined signal processing to output data received from the memory cell block 110 to the outside of the semiconductor memory apparatus 700 through the pad 410; a common global data line GIO coupled between the memory cell block 110 and the data input unit 420, 430 and between the memory cell block 110 and the data output unit 460, 470; a data bus inversion unit (hereinafter, referred to as "DBI") 710 provided on the common global data line GIO that may invert the data interactively transmitted through the common global data line GIO, according to the Comparison result of the data and previous data; an error detection code generator (hereinafter, referred to as an "EDC") 490 which may generate and output an error detection code R<0:7> including a plurality of bits to detect whether or not the data input to the DBI 710 and the data output from the DBI 710 includes an error; a second register 500 which may store the error detection code R<0:7> and output it in a unit of predetermined bits in response to a second timing signal FIFO_INSTBP; a multiplexer (hereinafter, referred to as a "MUX") 720 which may select one of the different timing signals DINSTBP_D and IOSASTBP_D in response to the control signal RDWT and output the selected signal as the second timing signal FWFO_INSTBP; and a second parallel-to-serial converter (PSC_2) 510 which performs parallel-to-serial conversion of the error detection code R<0:7> received from the second register 500.

According to the fourth exemplary embodiment of the present invention, the semiconductor memory apparatus 700 may have a DBI function and may share the common global data line GIO between the write operation and the read operation of the semiconductor memory apparatus 700, in which the DBI 710 is provided on the common global data line GIO. The semiconductor memory apparatus 700 may receive 72-bit data that includes 64-bit data and the 8-bit DBI signal, and the DBI 710 sends the memory cell block 110 the 64-bit data which may be inverted or not inverted on the basis of the 8-bit DBI signal. Further, the DBI 710 may compare the 64-bit data output from the memory cell block 110 with the previous data output from the memory cell block 110, and outputs the 8-bit DBI signal, thereby outputting a total of 72-bit data including the 64-bit data and the 8-bit DBI signal to the GPU 200 through the pad 410. As compared with the foregoing exemplary embodiments, this fourth exemplary embodiment may only be different in the number of data bits to be processed, but may be similar in the read and write operations and generation of an error detection code R<0:7> of the semiconductor memory apparatus 700.

According to the fourth exemplary embodiment of the present invention, to make the data used for generating the error detection code R<0:7> be a total of 72-bits including the DBI signal, an input wiring line of the EDC 490 may be branched from the common global data line GIO between the DBI 710 and the data input unit 420, 430 and between the DBI 710 and the data output unit 460, 470.

According to the fourth exemplary embodiment of the present invention, the common global data line GIO shared between the write operation and the read operation of the semiconductor memory apparatus is disposed throughout the largest area in the semiconductor memory apparatus 700 as compared with other signal lines and secures the most layout margin. Thus, the data used for generating the error detection code R<0:7> is received from the common global data line GIO, thereby minimizing the wiring and circuit areas due for generation of the error detection code.

As described above, the semiconductor memory apparatus capable of detecting an error in data input/output according to an exemplary embodiment of the present invention may provide a system using the same with information for detecting an error in data transmission, so that reliability of the data transmission between the semiconductor memory apparatus and the system using the semiconductor memory apparatus is enhanced.

Further, since a global data line, which may be disposed throughout the largest area and secures the most layout margin of the semiconductor memory apparatus, is used in generating information to detect an error in data transmission, it is possible to minimize circuits and interconnections.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A semiconductor memory apparatus capable of detecting an error in data input/output, comprising:
    a memory cell block including a plurality of memory cells;
    a data input unit configured to receive data from outside the semiconductor memory apparatus and perform predetermined signal processing to record the received data in the memory cell block;
    a first global data line coupled between the data input unit and the memory cell block;
    a data output unit configured to receive data from the memory cell block and perform predetermined signal processing to output the received data to the outside of the semiconductor memory apparatus;
    a second global data line coupled between the memory cell block and the data output unit;
    a multiplexer configured to selectively output data from the first or second global data line in response to a control signal; and
    an error detection code generator configured to generate an error detection code having a plurality of bits to indicate whether the data output from the multiplexer includes an error, and output the error detection code to the outside of the semiconductor memory apparatus.

2. The semiconductor memory apparatus as set forth in claim 1, wherein the data input unit comprises:
    a serial-to-parallel converter configured to convert serial data received from the outside of the semiconductor memory apparatus to parallel data; and
    a latch unit configured to latch the parallel data and output the parallel data to the first global data line in response to a first timing signal.

3. The semiconductor memory apparatus as set forth in claim 2, wherein the first timing signal is generated by a write command input from the outside of the semiconductor memory apparatus.

4. The semiconductor memory apparatus as set forth in claim 1, wherein the data output unit comprises:
    a register configured to store parallel data received from the memory cell block through the second global data line and output the parallel data in a unit of predetermined bits; and
    a parallel-to-serial converter configured to convert the parallel data output from the register to serial data and output the serial data.

5. The semiconductor memory apparatus as set forth in claim 1, wherein the control signal varies in level according to whether the semiconductor memory apparatus is in a read or write operation.

6. The semiconductor memory apparatus as set forth in claim 1, wherein the error detection code generator comprises a logic circuit configured to divide a decimal value of the data output from the multiplexer by a preset divisor, calculate a decimal value corresponding to a remainder obtained by the division, and generate the error detection code corresponding to the calculated decimal value.

7. The semiconductor memory apparatus as set forth in claim 1, further comprising:
    a register configured to store the error detection code and output the error detection code in a unit of predetermined bits in response to a second timing signal;
    a multiplexer configured to select one among signals having different timings in response to the control signal and output the selected signal as the second timing signal; and
    a parallel-to-serial converter configured to perform parallel-to-serial conversion of the error detection code output from the register and output the converted code.

8. The semiconductor memory apparatus as set forth in claim 7, wherein the second timing signal is enabled after a data processing time of the error detection code generator elapses from a time when the data input unit starts to output data, or is enabled after a data processing time of the error detection code generator elapses from a time when the memory cell block starts to output data.

9. A semiconductor memory apparatus capable of detecting an error in data input/output, comprising:
    a memory cell block including a plurality of memory cells;
    a data input unit configured to receive data from outside the semiconductor memory apparatus and perform predetermined signal processing to record the received data in the memory cell block;
    a first global data line coupled between the data input unit and the memory cell block;
    a first data bus inversion unit provided on the first global data line, configured to invert the data received through the first global data line according to a comparison result of the data and previous data; and output the inverted data to the memory cell block;
    a data output unit configured to receive data from the memory cell block and perform predetermined signal processing to output the received data to the outside of the semiconductor memory apparatus;
    a second global data line coupled between the memory cell block and the data output unit;
    a second data bus inversion unit provided on the second global data line, configured to invert the data received from the memory cell block through the second global data line according to a comparison result of the data and previous data, and output the inverted data;
    a multiplexer configured to selectively output data from the first global data line coupled between the data input unit and the first data bus inversion unit or the second global data line coupled between the second data bus inversion unit and the data output unit according to whether the semiconductor memory apparatus is in a read or write operation; and
    an error detection code generator configured to generate an error detection code having a plurality of bits to indicate whether the data output from the multiplexer includes an error, and output the error detection code to the outside of the semiconductor memory apparatus.

10. The semiconductor memory apparatus as set forth in claim 9, wherein the data input unit comprises:
- a serial-to-parallel converter configured to convert serial data received from the outside of the semiconductor memory apparatus to parallel data; and
- a latch unit configured to latch the parallel data and output the parallel data to the first global data line.

11. The semiconductor memory apparatus as set forth in claim 9, wherein the data output unit comprises:
- a register configured to store parallel data received through the second global data line and output the parallel data in a unit of predetermined bits; and
- a parallel-to-serial converter configured to convert the parallel data output from the register to serial data, and output the serial data.

12. The semiconductor memory apparatus as set forth in claim 9, wherein the error detection code generator comprises; a logic circuit configured to divide a decimal value of the data output from the multiplexer by a preset divisor, calculate a decimal value corresponding to a remainder obtained by the division, and generate the error detection code corresponding to the calculated decimal value.

13. The semiconductor memory apparatus as set forth in claim 9, further comprising:
- a register to store the error detection code and configured to output the error detection code in a unit of predetermined bits in response to a timing signal;
- a multiplexer configured to select one among signals having different timings according to whether the semiconductor memory apparatus is in a read or write operation and output the selected signal to the register; and
- a parallel-to-serial converter configured to perform parallel-to-serial conversion of the error detection code output from the register and output the converted code.

14. The semiconductor memory apparatus as set forth in claim 13, wherein the timing signal is enabled after a data processing time of the error detection code generator elapses from a time when the data input unit starts to output data during the write operation, or enabled after a data processing time of the error detection code generator elapses from a time when the memory cell block starts to output data during the read operation.

15. A semiconductor memory apparatus capable of detecting an error in data input/output, comprising:
- a memory cell block including a plurality of memory cells;
- a data input unit configured to receive data from outside the semiconductor memory apparatus and perform predetermined signal processing to record the received data in the memory cell block;
- a data output unit configured to receive data from the memory cell block and perform predetermined signal processing to output the received data to the outside of the semiconductor memory apparatus;
- a global data line commonly coupled between the memory cell block and the data input unit and between the memory cell block and the data output unit; and
- an error detection code generator configured to generate an error detection code having a plurality of bits to indicate whether the data transmitted through the global data line includes an error, and output the error detection code to the outside of the semiconductor memory apparatus,
wherein the data input unit comprises:
- a serial-to-parallel converter configured to convert data received from the outside of the semiconductor memory apparatus to parallel data, and
- a latch unit configured to latch the parallel data and output the parallel data to the global data line in response to a first timing signal.

16. The semiconductor memory apparatus as set forth in claim 15, wherein the first timing signal is generated by a write command input from the outside of the semiconductor memory apparatus.

17. The semiconductor memory apparatus as set forth in claim 15, wherein the data output unit comprises:
- a register that stores parallel data received from the memory cell block through the global data line and configured to output the parallel data in a unit of predetermined bits; and
- a parallel-to-serial converter configured to convert the parallel data output from the register to serial data, and output the serial data.

18. The semiconductor memory apparatus as set forth in claim 15, wherein the error detection code generator comprises a logic circuit configured to divide a decimal value of the data transmitted through the common global data line by a preset divisor, calculate a decimal value corresponding to a remainder obtained by the division, and generate the error detection code corresponding to the calculated decimal value.

19. The semiconductor memory apparatus as set forth in claim 15, further comprising:
- a register to store the error detection code and configured to output the error detection code in a unit of predetermined bits in response to a second timing signal;
- a multiplexer configured to select one among of signals having different timings according to whether the semiconductor memory apparatus is in a read or write operation and output the selected signal as the second timing signal; and
- a parallel-to-serial converter configured to perform parallel-to-serial conversion of the error detection code output from the register, and output the converted code.

20. The semiconductor memory apparatus as set forth in claim 19, wherein the second timing signal is enabled after a data processing time of the error detection code generator elapses from a time when the data input unit starts to output data, or enabled after a data processing time of the error detection code generator elapses from a time when the memory cell block starts to output data.

21. A semiconductor memory apparatus capable of detecting an error in data input/output, comprising:
- a memory cell block including a plurality of memory cells;
- a data input unit configured to receive data from outside the semiconductor memory apparatus and perform predetermined signal processing to record the received data in the memory cell block;
- a data output unit configured to receive data from the memory cell block and perform predetermined signal processing to output the received data to the outside of the semiconductor memory apparatus;
- a global data line commonly coupled between the memory cell block and the data input unit and between the memory cell block and the data output unit;
- a data bus inversion unit provided on the global data line, configured to invert data transmitted through the global data line according to a comparison result of the data and previous data, and output the inverted data; and
- an error detection code generator configured to generate an error detection code having a plurality of bits to detect whether the data input to and output from the data bus inversion unit includes an error, and output the error detection code to the outside of the semiconductor memory apparatus.

22. The semiconductor memory apparatus as set forth in claim 21, wherein the data input unit comprises:
- a serial-to-parallel converter configured to convert data received from the outside of the semiconductor memory apparatus to parallel data; and
- a latch unit configured to latch the parallel data and output the parallel data to the global data line in response to a first timing signal.

23. The semiconductor memory apparatus as set forth in claim 22, wherein the first timing signal is generated by a write command input from the outside of the semiconductor memory apparatus.

24. The semiconductor memory apparatus as set forth in claim 21, wherein the data output unit comprises:
- a register to store parallel data received from the memory cell block through the global data line and configured to output the parallel data in a unit of predetermined bits; and
- a parallel-to-serial converter configured to convert the parallel data output from the register to serial data and output the serial data.

25. The semiconductor memory apparatus as set forth in claim 21, wherein the error detection code generator comprises a logic circuit configured to divide a decimal value of the data input to and output from the data bus inversion unit by a preset divisor, calculate a decimal value corresponding to a remainder obtained by the division, and generate the error detection code corresponding to the calculated decimal value.

26. The semiconductor memory apparatus as set forth in claim 21, further comprising:
- a register to store the error detection code and configured to output the error detection code in a unit of predetermined bits in response to a second timing signal;
- a multiplexer configured to select one among signals having different timings according to whether the semiconductor memory apparatus is in a read or write operation and output the selected signal as the second timing signal; and
- a parallel-to-serial converter configured to perform parallel-to-serial conversion of the error detection code output from the register, and output the converted code.

27. The semiconductor memory apparatus as set forth in claim 26, wherein the second timing signal is enabled after a data processing time of the error detection code generator elapses from a time when the data input unit starts to output data, or enabled after a data processing time of the error detection code generator elapses from a time when the memory cell block starts to output data.

* * * * *